United States Patent
Kim

(10) Patent No.: US 12,438,027 B2
(45) Date of Patent: Oct. 7, 2025

(54) SYSTEM FOR DETERMINING WHETHER TRANSFER ROBOT IS NORMAL, METHOD FOR DETERMINING WHETHER TRANSFER ROBOT IS NORMAL, AND SUBSTRATE TREATING APPARATUS

(71) Applicant: SEMES CO., LTD., Chungcheongnam-do (KR)

(72) Inventor: Hyun Jun Kim, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 906 days.

(21) Appl. No.: 17/541,427

(22) Filed: Dec. 3, 2021

(65) Prior Publication Data

US 2022/0199446 A1 Jun. 23, 2022

(30) Foreign Application Priority Data

Dec. 18, 2020 (KR) .................. 10-2020-0178380

(51) Int. Cl.
*H01L 21/68* (2006.01)
*B25J 9/16* (2006.01)
(Continued)

(52) U.S. Cl.
CPC ............ *H01L 21/68* (2013.01); *B25J 9/1674* (2013.01); *B25J 19/02* (2013.01); *H01L 21/68707* (2013.01)

(58) Field of Classification Search
CPC ...... B25J 11/0095; B25J 9/1674; B25J 9/042; B25J 9/021; B25J 9/02; B25J 9/1692;
(Continued)

(56) References Cited

U.S. PATENT DOCUMENTS

| | | | | |
|---|---|---|---|---|
| 4,602,163 A | * | 7/1986 | Pryor | ..................... B25J 19/022 |
| | | | | 901/47 |
| 7,424,339 B2 | * | 9/2008 | Yoshida | .................. G01S 17/42 |
| | | | | 700/121 |
| 2003/0060922 A1 | * | 3/2003 | Schauer | ............ H01L 21/67265 |
| | | | | 700/213 |

FOREIGN PATENT DOCUMENTS

| | | |
|---|---|---|
| JP | 2000-512565 A | 9/2000 |
| JP | 5943914 B2 | 7/2016 |

(Continued)

OTHER PUBLICATIONS

Request for the Submission of an Opinion by the Korean Intellectual Property Office on Nov. 11, 2022 in corresponding KR Patent Application No. 10-2020-0178380, with English Translation.

*Primary Examiner* — Timothy R Waggoner
(74) *Attorney, Agent, or Firm* — Carter, DeLuca & Farrell LLP

(57) ABSTRACT

Disclosed is a substrate treating apparatus including a transfer chamber for transferring a substrate. The transfer chamber may include a hand on which the substrate is placed, an arm connected to the hand, a first member that supports the hand and the arm and move to transfer the substrate, a second member that supports the first member, a sensor detection member attached to the first member, a sensor member attached to the second member, and a determination unit that determines whether or not transfer is normal in the transfer chamber through a distance between the sensor detection member and the sensor member.

2 Claims, 9 Drawing Sheets

(51) Int. Cl.
*B25J 19/02* (2006.01)
*H01L 21/687* (2006.01)

(58) Field of Classification Search
CPC ..... H01L 2224/75001; H01L 21/67259; H01L 21/68; H01L 21/681; Y10S 901/02
See application file for complete search history.

(56) References Cited

FOREIGN PATENT DOCUMENTS

| | | |
|---|---|---|
| KR | 10-2010-0060090 A | 6/2010 |
| KR | 10-2010-0063369 A | 6/2010 |
| KR | 10-1947178 B1 | 2/2019 |

\* cited by examiner

SYSTEM FOR DETERMINING WHETHER TRANSFER ROBOT IS NORMAL, METHOD FOR DETERMINING WHETHER TRANSFER ROBOT IS NORMAL, AND SUBSTRATE TREATING APPARATUS

CROSS-REFERENCE TO RELATED APPLICATIONS

A claim for priority under 35 U.S.C. § 119 is made to Korean Patent Application No. 10-2020-0178380 filed on Dec. 18, 2020, in the Korean Intellectual Property Office, the entire contents of which are hereby incorporated by reference.

BACKGROUND

Embodiments of the inventive concept described herein relate to a system for determining whether transfer robot is normal, a method for determining whether a transfer robot is normal, and a substrate treating apparatus.

To manufacture a semiconductor device or a liquid crystal display, various processes such as a photolithography process, an etching process, an ashing process, an ion implantation process, a thin film deposition process, and a cleaning process are performed on a substrate. Among them, the photolithography process is a process for forming a desired circuit pattern on the substrate, in which an application process, an exposure process and a development process are sequentially performed. In the application process, a photosensitive liquid such as photoresist is applied onto the substrate, in the exposure process, a circuit pattern is exposed on the substrate on which a photosensitive film is formed, and in the development process, an exposed area on the substrate is selectively developed. Further, in the etching process or the cleaning process on the substrate, a chemical treatment operation, a rinse treatment operation, and a drying treatment operation are roughly and sequentially performed. In the chemical treatment operation, a chemical for etching a thin film formed on the substrate or removing foreign substances on the substrate is supplied to the substrate, and in the rinse treatment operation, a rinse liquid such as pure water is supplied onto the substrate. A substrate treating apparatus transfers the substrate from one location to another location through a transfer robot.

However, various problems may occur during operation of the transfer robot. One of the problems that may occur during the operation is that a hardware reference point is misaligned due to the misalignment of an axis or the failure of a sensor that measures a reference point during the operation of the transfer robot, a wafer is transferred while being misaligned with target points of each taught unit, and thus the water cannot be transported accurately. Another problem is that the transfer robot measures the position of the wafer, corrects the position by the amount of misalignment, and places the wafer on a target point of the unit, and in this case, when the sensor that measures the wafer is misaligned, an error occurs by the misaligned degree of the reference point, and thus the wafer is incorrectly seated in the unit.

Thus, an apparatus and method for recognizing and detecting the above problems in advance have been required.

SUMMARY

Embodiments of the inventive concept provide a system capable of periodically determining whether or not a transfer robot is normal.

The problems to be solved by the inventive concept are not limited to the aforementioned problems. The unmentioned other technical problems may be clearly understood by those skilled in the art to which the inventive concept pertains from the following description.

A determination system capable of determining whether or not a transfer robot that transfers a substrate is normal according to an example of the inventive concept is disclosed.

According to an embodiment, the system includes a sensor detection member attached to a moving member to transfer the substrate, a sensor member attached to a support member that supports the moving member to transfer the substrate, and a determination unit that determines whether or not the transfer robot is normal through a distance between the sensor detection member and the sensor member.

According to an example, the moving member to transfer the substrate may be driven through a motor, and the determination unit may determine whether or not the transfer robot is normal using a Z phase of the motor.

According to an example, the determination unit may set, as a first location, a location in which the sensor detection member is detected in the sensor member and set, as a second location, a location in which the moving member moves from the first location by the Z phase of the motor.

According to an example, the determination unit may determine whether or not the transfer robot is normal on the basis of a difference value between the second location and the first location.

According to an example, the determination unit may perform a control to use the difference value between the second location and the first location as a reference value, to periodically measure the difference value between the second location and the first location, and to generate an alarm when a difference between the reference value and the measured difference value exceeds a certain range.

A substrate treating apparatus including a transfer chamber for transferring a substrate according to another embodiment of the inventive concept is disclosed.

According to an embodiment, the transfer chamber includes a hand on which the substrate is placed, an arm connected to the hand, a first member that supports the hand and the arm and moves to transfer the substrate, a second member that supports the first member, a sensor detection member attached to the first member, a sensor member attached to the second member, and a determination unit that determines whether or not transfer is normal in the transfer chamber through a distance between the sensor detection member and the sensor member.

A method of determining whether or not a transfer robot that transfers a substrate is normal according to still another embodiment is disclosed.

According to an embodiment, the method includes measuring a reference value for determining whether or not the transfer robot is normal, positioning the transfer robot to a reference location of the transfer robot, moving the transfer robot by an amount corresponding to the Z phase of the motor driving the transfer robot, and comparing the reference value with a difference value between the reference location and a location in which the transfer robot is moved.

According to an example, the positioning of the transfer robot to the reference location of the transfer robot may include positioning the transfer robot in a location in which a sensor member attached to a second member for supporting a first member is detected in a sensor detection member attached to the first member for driving the transfer robot.

According to an example, the moving of the transfer robot by the amount corresponding to the Z phase of the motor driving the transfer robot may include positioning the transfer robot in a location when the first member is driven by the amount corresponding to the Z phase of the motor driving the first member.

According to an example, the comparing of the reference value with the difference value between the reference location and the location in which the transfer robot is moved may include generating an alarm when the difference value deviates from an error range of the reference value.

According to an example, the positioning of the transfer robot to the reference location of the transfer robot, the moving of the transfer robot by the amount corresponding to the Z phase of the motor driving the transfer robot, and comparing of the reference value with the difference value between the reference location and the location in which the transfer robot is moved may be repeatedly performed at a certain period.

According to an example, the measuring of the reference value for determining whether or not the transfer robot is normal may include setting, as a reference value, a value obtained by measuring and averaging the difference value between the reference location and the location in which the transfer robot is moved.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
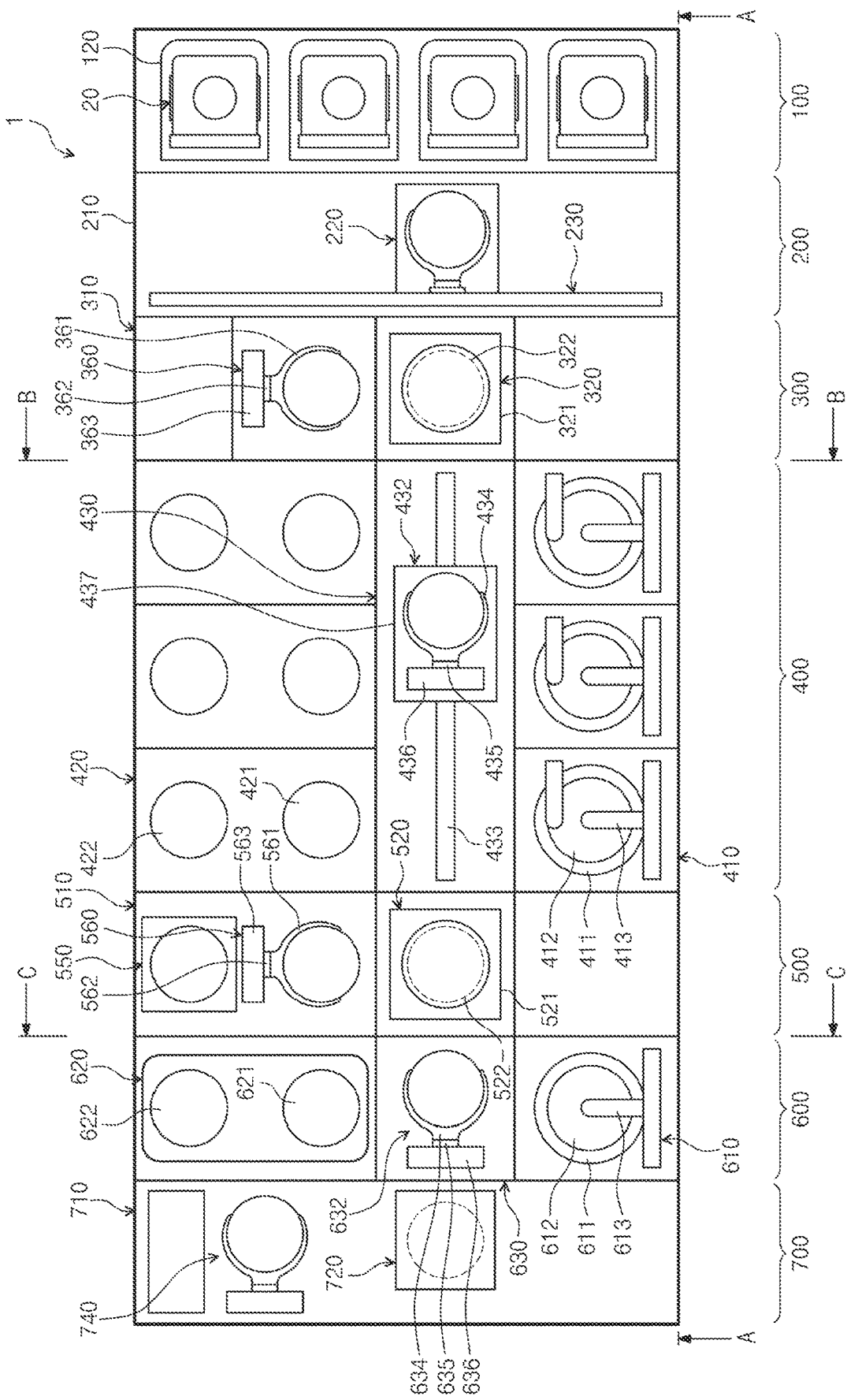
FIG. 1 is a view illustrating a substrate treating apparatus when viewed from above.

Hereinafter, embodiments of the inventive concept will be described in detail with reference to the accompanying drawings so that those skilled in the art to which the inventive concept pertains may easily carry out the inventive concept. However, the inventive concept may be implemented in various different forms, and is not limited to the embodiments described here. Further, in a description of the embodiments of the inventive concept, a detailed description of related known functions or configurations will be omitted when they make the essence of the inventive concept unnecessarily unclear. In addition, the same reference numerals are used for parts that perform similar functions and operations throughout the drawings.

The expression of 'including' some elements may mean that another element may be further included without being excluded unless there is a particularly contradictory description. In detail, the terms "including" and "having" are used to designate that the features, the numbers, the steps, the operations, the elements, the parts, or combination thereof described in the specification are present, and may be understood that one or more other features, numbers, step, operations, elements, parts, or combinations thereof may be added.

Singular expressions include plural expressions unless clearly otherwise indicated in the context. Further, in the drawings, the shapes and sizes of the elements may be exaggerated for clearer description.

The terms such as first and second may be used to describe various elements, but the elements are not limited to the terms. The terms are only used to distinguish one component from another component. For example, without departing from the scope and spirit of the inventive concept, a first component may be referred to as a second component, and similarly, the second component may be also referred to as the first component.

The term "~unit" used throughout the present specification is a unit that processes at least one function or operation, and may refer to, for example, a software component or a hardware component such as a field-programmable gate array (FPGA) or an application-specific integrated circuit (ASIC). However, "~unit" is not limited to the software or the hardware. "~unit" may be present in an addressable storage medium or may refresh one or more processors.

As an example, "~unit" may include components such as software components, object-oriented software components, class components, and a task component and may include processes, functions, properties, procedures, sub-routines, segments of a program code, drivers, firmwares, micro-codes, circuits, data, database, data structures, tables, arrays, and variables. A function provided by a component and a "~unit" may be performed separately by a plurality of components and "~units" and may be integrated with another additional component.

Hereinafter, embodiments of the inventive concept will be described in more detail with reference to the accompanying drawings. The embodiments of the inventive concept may be modified into various forms, and the scope of the inventive concept should not be construed to be limited to the following embodiments. The present embodiments are provided to describe the inventive concept for those skilled in the art more completely. Thus, the shapes of the components of the drawings are exaggerated to emphasize a clearer description thereof.

Hereinafter, embodiments of the inventive concept will be described in more detail with reference to the accompanying drawings. The embodiments of the inventive concept may be modified into various forms, and the scope of the inventive concept should not be construed to be limited to the following embodiments. The present embodiments are provided to describe the inventive concept for those skilled in the art more completely. Thus, the shapes of the components of the drawings are exaggerated to emphasize a clearer description thereof.

Equipment of the present embodiment may be used to perform a photolithography process on a substrate such as a semiconductor wafer or a flat display panel. In particular, the equipment of the present embodiment may be connected to an exposure device to perform an application process and a development process on the substrate. Hereinafter, a case in which a wafer is used as the substrate will be described as an example.

Figure 2:
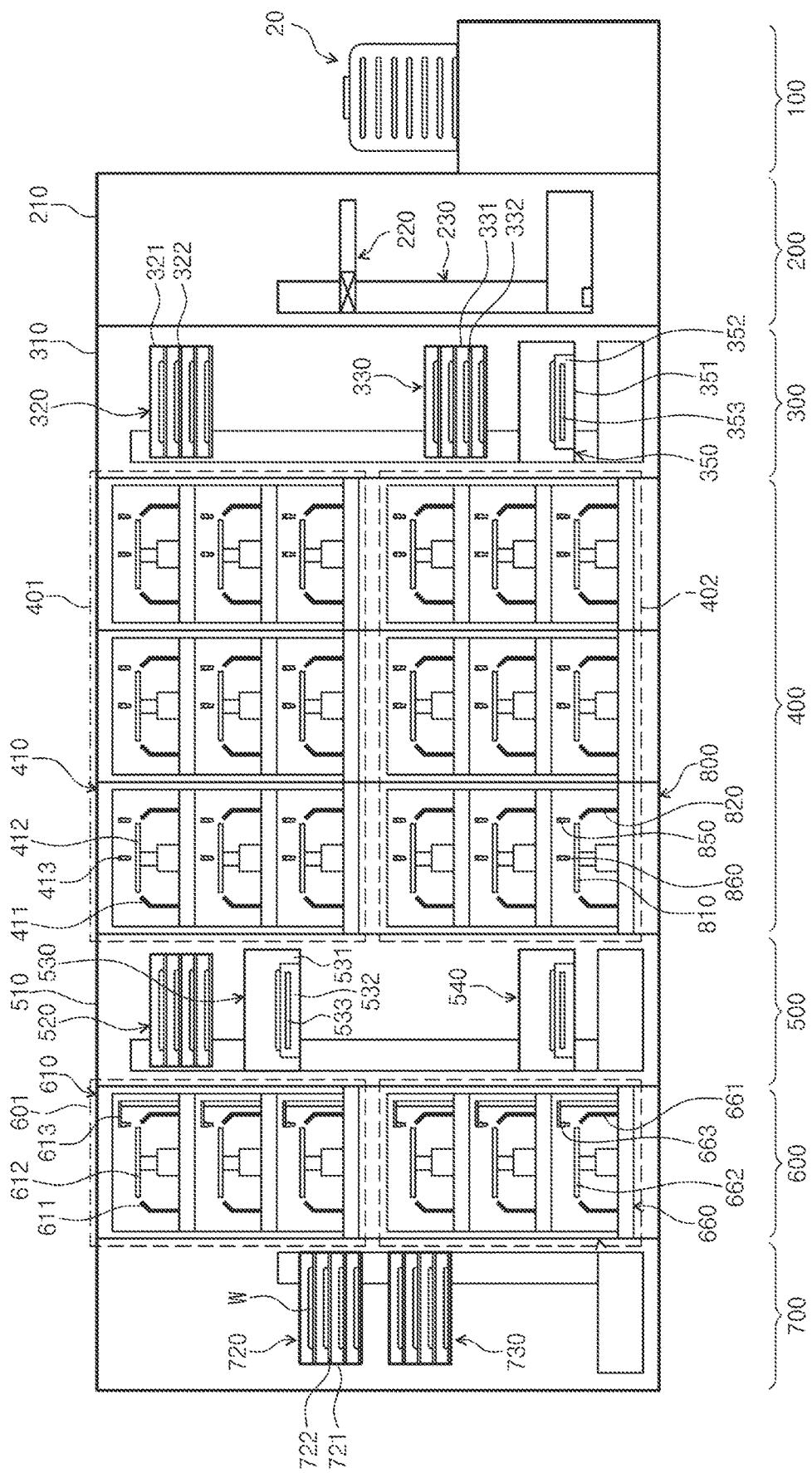
FIG. 2 is a view taken along line A-A of equipment of FIG. 1.
Figure 3:
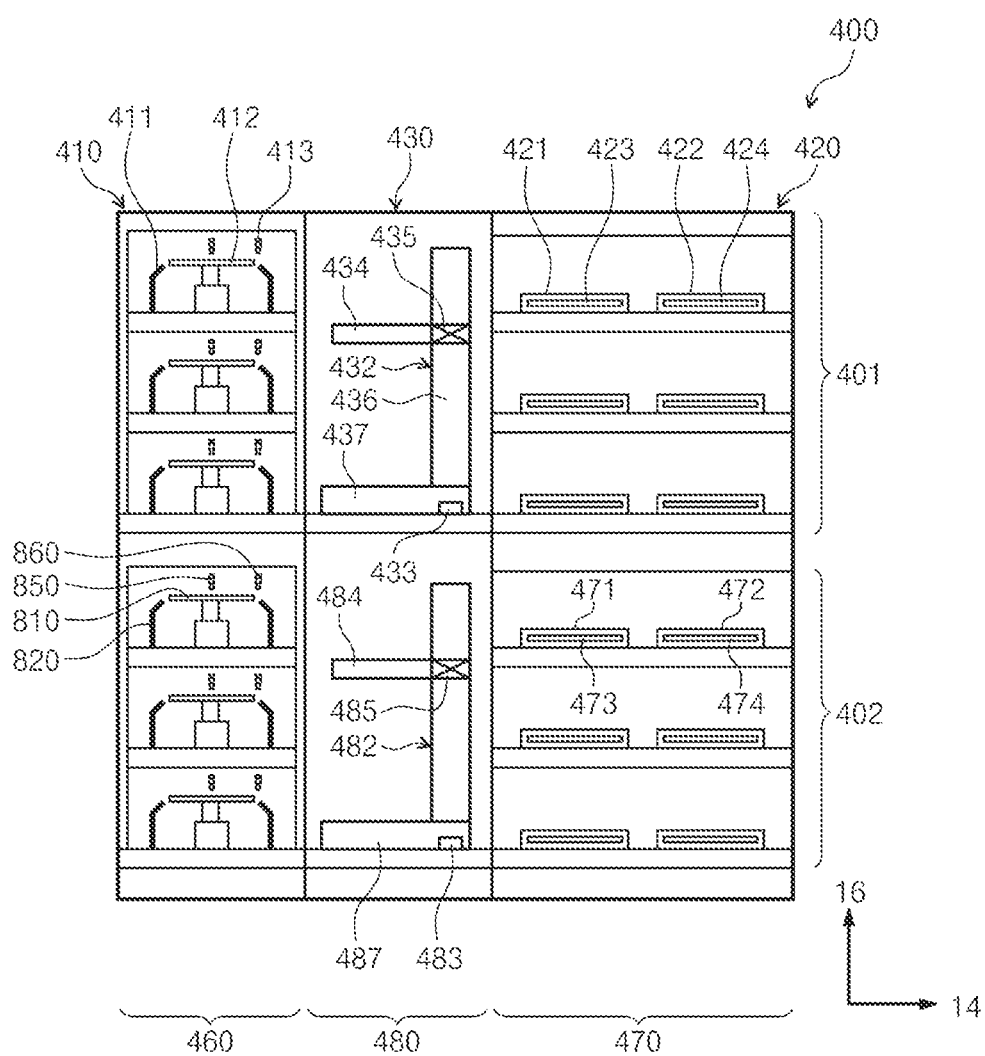
FIG. 3 is a view taken along line B-B of the equipment of FIG. 1.
Figure 4:
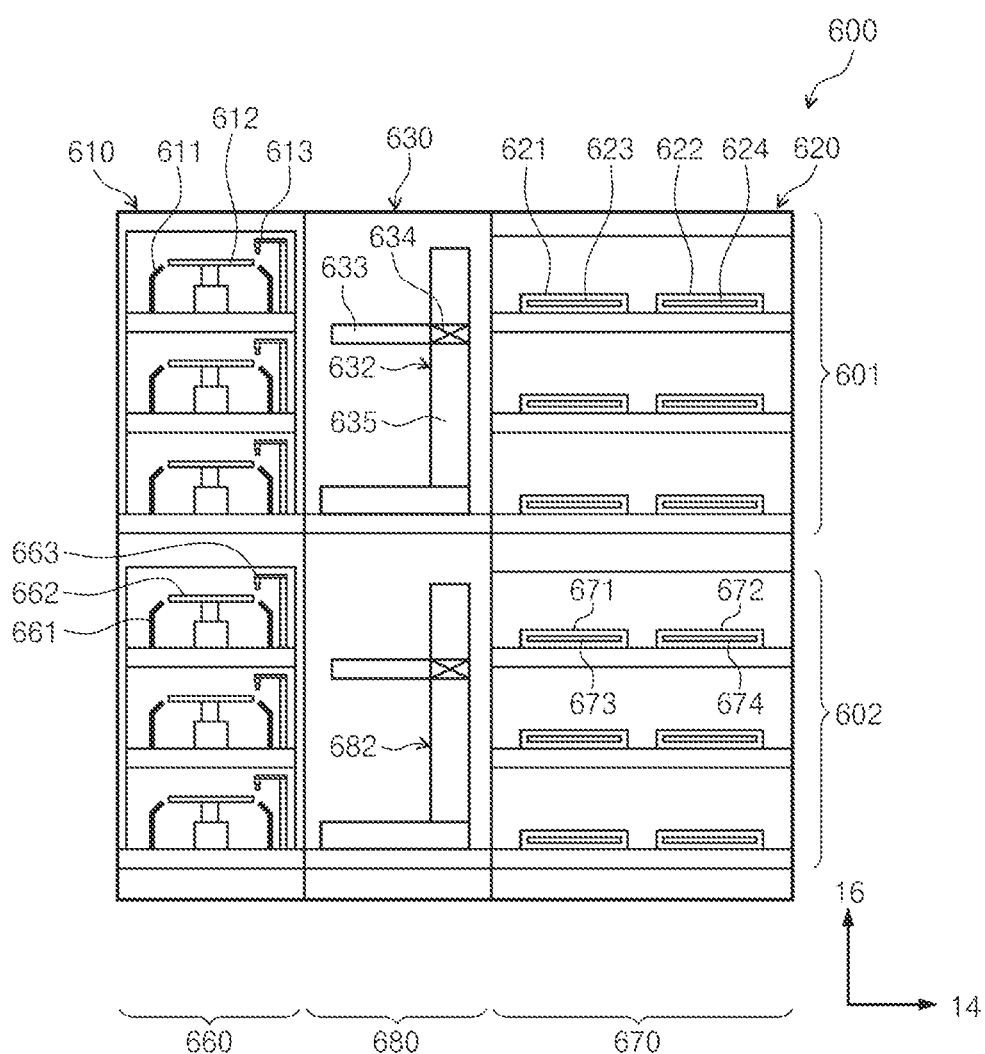
FIG. 4 is a view taken along line C-C of the equipment of FIG. 1.

FIG. 1 is a view illustrating a substrate treating apparatus when viewed from above, FIG. 2 is a view taken along line A-A of equipment of FIG. 1, FIG. 3 is a view taken along line B-B of equipment of FIG. 1, and FIG. 4 is a view taken along line C-C of the equipment of FIG. 1.

Referring to FIGS. 1 to 4, a substrate treating apparatus 1 includes a load port 100, an index module 200, a linkage module 300, an application and development module 400, a buffer module 500, a pre-exposure or post-exposure treating module 600, and an interface module 700. The load port 100, the index module 200, the linkage module 300, the application and development module 400, the buffer module 500, the pre-exposure or post-exposure treating module 600, and the interface module 700 are sequentially arranged in a row in one direction.

Hereinafter, a direction, in which the load port 100, the index module 200, the linkage module 300, the application and development module 400, the buffer module 500, the pre-exposure or post-exposure treating module 600, and the interface module 700 are arranged, refers to a first direction 12, a direction that is perpendicular to the first direction 12 when viewed from above refers to a second direction 14, and a direction that is perpendicular to the first direction 12 and the second direction 14 refers to a third direction 16.

A substrate "W" is moved while being accommodated in a cassette 20. In this case, the cassette 20 has a structure that may be sealed from the outside. For example, a front open unified pod (FOUP) having a door on a front side thereof may be used as the cassette 20.

Hereinafter, the load port 100, the index module 200, the linkage module 300, the application and development module 400, the buffer module 500, the pre-exposure or post-exposure treating module 600, and the interface module 700 will be described in detail.

The load port 100 has a mounting table 120 on which the cassette 20 in which the substrates "W" are accommodated is placed. The mounting table 120 is provided as a plurality of mounting tables 120, and the mounting tables 120 are aligned in the second direction 14. In FIG. 2, four mounting tables 120 are provided.

The index module 200 transports the substrate "W" between the linkage module 300 and the cassette 20 placed on the mounting table 120 of the load port 100. The index module 200 has a frame 210, an index robot 220, and a guide rail 230. The frame 210 is provided in a substantially rectangular parallelepiped shape having an empty interior and is disposed between the load port 100 and the linkage module 300. The frame 210 of the index module 200 may be provided at a lower height than that of a frame 310 of the linkage module 300. The index robot 220 and the guide rail 230 are arranged inside the frame 210. The index robot 220 picks up and places the substrate "W". The index robot 220 may be moved along the guide rail 230. Further, the index robot 220 may be rotatable with respect to the guide rail 230. Further, although not illustrated, a door opener for opening or closing a door of the cassette 20 is further provided in the frame 210.

The linkage module 300 may be located in a path through which the substrate "W" to be treated is carried out from the cassette 20 and is then carried in the cassette 20 or the treated substrate "W" is carried out to the cassette 20, and the substrate "W" may be temporarily located in the linkage module 300. The linkage module 300 has the frame 310, a first buffer 320, a second buffer 330, a cooling chamber 350, and a first buffer robot 360. The frame 310 is provided in a rectangular parallelepiped shape having an empty interior and is disposed between the index module 200 and the application and development module 400. The first buffer 320, the second buffer 330, the cooling chamber 350, and the first buffer robot 360 are located inside the frame 310. The cooling chamber 350, the second buffer 330, and the first buffer 320 are arranged sequentially from the bottom in the third direction 16. The first buffer 320 is located at a height corresponding to an application module 401 of the application and development module 400, which will be described below, and the second buffer 330 and the cooling chamber 350 are located at a height corresponding to a development module 402 of the application and development module 400, which will be described below. The first buffer robot 360 is located to be spaced apart from the second buffer 330, the cooling chamber 350, and the first buffer 320 by a predetermined distance in the second direction 14.

The first buffer 320 and the second buffer 330 temporarily store the plurality of substrates "W". The second buffer 330 has a housing 331 and a plurality of supports 332. The supports 332 are arranged inside the housing 331 and are provided to be spaced apart from each other in the third direction 16. One substrate "W" is placed on each support 332. The housing 331 has openings (not illustrated) in a direction in which the index robot 220 is provided, in a direction in which the first buffer robot 360 is provided, and in a direction in which a development unit robot 482 of the development module 402, which will be described below, is provided, so that the index robot 220, the first buffer robot 360, and a development robot 482 may carry the substrate "W" in or out from the support 332 in the housing 331. The first buffer 320 has a structure that is substantially similar to that of the second buffer 330. However, a housing 321 of the first buffer 320 has openings in a direction in which the first buffer robot 360 is provided and in a direction in which an application unit robot 432 located in the application module 401, which will be described below, is provided. The number of supports 322 provided in the first buffer 320 may be identical to or different from the number of supports 332 provided in the second buffer 330. According to an example, the number of supports 332 provided in the second buffer 330 may be greater than the number of supports 322 provided in the first buffer 320.

The first buffer robot 360 transports the substrate "W" between the first buffer 320 and the second buffer 330. The first buffer robot 360 has a hand 361, an arm 362, and a support 363. The hand 361 is fixedly installed in the arm 362. The arm 362 may be provided in a stretchable structure to allow the hand 361 to be movable in the second direction 14. The arm 362 is coupled to the support 363 to be linearly movable in the third direction 16 along the support 363. The support 363 has a length extending from a location corresponding to the second buffer 330 to a location corresponding to the first buffer 320. The support 363 may be provided longer in an upward or downward direction than the length. The first buffer robot 360 may be provided so that the hand 361 is simply driven only in two axes in the second direction 14 and the third direction 16.

The cooling chamber 350 cools the substrate "W". The cooling chamber 350 has a housing 351 and a cooling plate 352. The cooling plate 352 has an upper surface on which the substrate "W" is placed and a cooling unit 353 that cools the substrate "W". Various methods such as cooling by cooling water and cooling using a thermoelectric element may be used as the cooling unit 353. Further, the cooling chamber 350 may be provided with a lift pin assembly (not illustrated) that positions the substrate "W" on the cooling plate 352. The housing 351 has openings (not illustrated) in the direction in which the index robot 220 is provided and in the direction in which the development unit robot 482 provided in the development module 402, which will be described below, is provided, so that the index robot 220 and the development robot 482 may carry the substrate "W" in or out from the cooling plate 352. Further, the cooling chamber 350 may be provided with doors (not illustrated) for opening or closing the above-described openings.

The application and development module 400 performs a process of applying photoresist onto the substrate "W" before an exposure process and a process of developing the substrate "W" after the exposure process. The application and development module 400 has a substantially rectangular parallelepiped shape. The application and development module 400 has the application module 401 and the development module 402. The application module 401 and the development module 402 are arranged to be partitioned from each other in layers. According to an example, the application module 401 is located above the development module 402.

The application module 401 performs a process of applying a photosensitive liquid such as the photoresist onto the substrate "W" and a heat treatment process of heating or cooling the substrate "W" before and after a resist application process. The application module 401 has a resist application chamber 410, a baking chamber 420, and a transfer chamber 430. The resist application chamber 410, the baking chamber 420, and the transfer chamber 430 are sequentially arranged in the second direction 14. Thus, the resist application chamber 410 and the baking chamber 420 are located to be spaced apart from each other in the second direction 14 with the transfer chamber 430 interposed therebetween. The resist application chamber 410 is provided as a plurality of resist application chambers 410, and the plurality of resist application chambers 410 are provided in the first direction 12 and the third direction 16. An example in which six resist application chambers 410 are provided is illustrated in the drawing. The plurality of baking chambers 420 are provided in the first direction 12 and the third direction 16. An example in which six baking chambers 420 are provided is illustrated in the drawing. However, unlike this, a larger number of baking chambers 420 may be provided.

The transfer chamber 430 is located in parallel with the first buffer 320 of the linkage module 300 in the first direction 12. The application unit robot 432 and a guide rail 433 are located inside the transfer chamber 430. The transfer chamber 430 has a substantially rectangular shape. The application unit robot 432 transports the substrate "W" between the baking chambers 420, the resist application chambers 410, the first buffer 320 of the linkage module 300, and a first cooling chamber 520 of the buffer module 500, which will be described below. The guide rail 433 is disposed so that a lengthwise direction thereof is parallel to the first direction 12. The guide rail 433 guides the application unit robot 432 to linearly move in the first direction 12. The application unit robot 432 has a hand 434, an arm 435, a support 436, and a pedestal 437. The hand 434 is fixedly installed in the arm 435. The arm 435 may be provided in a stretchable structure to allow the hand 434 to be movable in a horizontal direction. The support 436 is provided so that a lengthwise direction thereof is disposed in the third direction 16. The arm 435 is coupled to the support 436 to be linearly movable in the third direction 16 along the support 436. The support 436 is fixedly coupled to the pedestal 437, and the pedestal 437 is coupled to the guide rail 433 to be movable along the guide rail 433.

All the resist application chambers 410 have the same structure. However, the types of photoresist used in the resist application chambers 410 may be different from each other. As an example, a chemical amplification resist may be used as the photoresist. The resist application chamber 410 applies the photoresist onto the substrate "W". The resist application chamber 410 has a housing 411, a support plate 412, and a nozzle 413. The housing 411 has a cup shape having an open top. The support plate 412 is located inside the housing 411 and supports the substrate "W". The support plate 412 is provided rotatably. The nozzle 413 supplies the photoresist onto the substrate "W" placed on the support plate 412. The nozzle 413 has a circular tubular shape and may supply the photoresist to a center of the substrate "W". Optionally, the nozzle 413 may have a length corresponding to the diameter of the substrate "W", and an outlet of the nozzle 413 may be provided as a slit. Further, the resist application chamber 410 may be additionally provided with a nozzle 414 that supplies a cleaning liquid such as deionized water to clean a surface of the substrate "W" onto which the photoresist is applied.

The baking chamber 420 heat-treats the substrate "W". For example, the baking chambers 420 perform a pre-baking process of, before the photoresist is applied, heating the substrate "W" to a predetermined temperature to remove organic matters or moisture from the surface of the substrate "W", a soft baking process performed after the photoresist is applied onto the substrate "W", and a cooling process of cooling the substrate "W" after the heating process. The baking chamber 420 has a cooling plate 421 or a heating plate 422. The cooling plate 421 is provided with a cooling unit 423 such as cooling water or a thermoelectric element. Further, the heating plate 422 is provided with a heating unit 424 such as a heating wire or a thermoelectric element. The cooling plate 421 and the heating plate 422 may be provided in one baking chamber 420. Optionally, some of the baking chambers 420 may be provided with only the cooling plates 421 and the other thereof may be provided with only the heating plates 422.

The development module 402 performs a development process of, to obtain a pattern on the substrate "W", supplying a developer and removing a part of the photoresist and a heat treatment process of heating or cooling the substrate "W" before and after the development process. The development module 402 has a development chamber 800, a baking chamber 470, and a transfer chamber 480. The development chamber 800, the baking chamber 470, and the transfer chamber 480 are sequentially arranged in the second direction 14. Thus, the development chamber 800 and the baking chamber 470 are located to be spaced apart from each other in the second direction 14 with the transfer chamber 480 interposed therebetween. The development chamber 800 is provided as a plurality of development chambers 800, and the plurality of development chambers 800 are provided in the first direction 12 and the third direction 16. An example in which six development chambers 800 are provided is illustrated in the drawing. The plurality of baking chambers 470 are provided in the first direction 12 and the third direction 16. An example in which six baking chambers 470 are provided is illustrated in the drawing. However, unlike this, a larger number of baking chambers 470 may be provided.

The transfer chamber 480 is located in parallel with the second buffer 330 of the linkage module 300 in the first direction 12. The development unit robot 482 and a guide rail 483 are located inside the transfer chamber 480. The transfer chamber 480 has a substantially rectangular shape.

The development unit robot 482 transports the substrate "W" between the baking chambers 470, the development chambers 800, the second buffer 330 and the cooling chamber 350 of the linkage module 300, and a second cooling chamber 540 of the buffer module 500. The guide rail 483 is disposed so that a lengthwise direction thereof is parallel to the first direction 12. The guide rail 483 guides the development unit robot 482 to linearly move in the first direction 12. The development unit robot 482 has a hand 484, an arm 485, a support 486, and a pedestal 487. The hand 484 is fixedly installed in the arm 485. The arm 485 may be provided in a stretchable structure to allow the hand 484 to be movable in a horizontal direction. The support 486 is provided so that a lengthwise direction thereof is disposed in the third direction 16. The arm 485 is coupled to the support 486 to be linearly movable in the third direction 16 along the support 486. The support 486 is fixedly coupled in the pedestal 487. The pedestal 487 is coupled to the guide rail 483 to be movable along the guide rail 483.

The buffer module 500 is provided as a passage through which the substrate "W" is transported between the application and development module 400 and the pre-exposure or post-exposure treating module 600. Further, the buffer module 500 performs a predetermined process such as a cooling process or an edge exposure process on the substrate "W". The buffer module 500 has a frame 510, a buffer 520, a first cooling chamber 530, the second cooling chamber 540, an edge exposure chamber 550, and a second buffer robot 560. The frame 510 has a rectangular parallelepiped shape. The buffer 520, the first cooling chamber 530, the second cooling chamber 540, the edge exposure chamber 550, and the second buffer robot 560 are located inside the frame 510. The buffer 520, the first cooling chamber 530, and the edge exposure chamber 550 are arranged at a height corresponding to the application module 401. The second cooling chamber 540 is arranged at a height corresponding to the development module 402. The buffer 520, the first cooling chamber 530, and the second cooling chamber 540 are sequentially aligned in the third direction 16. When viewed from above, the buffer 520 is disposed in the first direction 12 together with the transfer chamber 430 of the application module 401. The edge exposure chamber 550 is disposed to be spaced apart from the buffer 520 or the first cooling chamber 530 by a predetermined distance in the second direction 14.

The second buffer robot 560 carries the substrate "W" between the buffer 520, the first cooling chamber 530, and the edge exposure chamber 550. The second buffer robot 560 is located between the edge exposure chamber 550 and the buffer 520. The second buffer robot 560 may be provided in a structure similar to that of the first buffer robot 360. The first cooling chamber 530 and the edge exposure chamber 550 perform a subsequent process on the substrate "W" on which the process has been performed in the application module 401. The first cooling chamber 530 cools the substrate "W" on which the process has been performed in the application module 401. The first cooling chamber 530 has a structure similar to that of the cooling chamber 350 of the linkage module 300. The edge exposure chamber 550 exposes an edge of the substrate "W" on which the cooling process has been performed in the first cooling chamber 530. The buffer 520 temporarily stores the substrates "W" before the substrates "W", on which the process has been performed in the edge exposure chamber 550, are carried in a pre-treatment module 601. The second cooling chamber 540 cools the substrates "W" before the substrates "W", on which a process has been performed in a post-treatment module 602 which will be described below, are carried in the development module 402. The buffer module 500 may further have a buffer added to a height corresponding to the development module 402. In this case, the substrates "W" on which the process has been performed in the post-treatment module 602 may be temporarily stored in the added buffer and may be then carried in the development module 402.

When an exposure device performs an immersion exposure process, the pre-exposure or post-exposure treating module 600 may process a process of applying a protective film protecting the photoresist film applied to the substrate "W" during immersion exposure. Further, the pre-exposure or post-exposure treating module 600 may perform a process of cleaning the substrate "W" after the exposure. Further, when the application process is performed using the chemical amplification resist, the pre-exposure or post-exposure treating module 600 may perform a post-exposure baking process.

The pre-exposure or post-exposure treating module 600 has the pre-treatment module 601 and the post-treatment module 602. The pre-treatment module 601 performs a process of treating the substrate "W" before the exposure process, and the post-treatment module 602 performs a process of treating the substrate "W" after the exposure process. The pre-treatment module 601 and the post-treatment module 602 are arranged to be partitioned from each other in layers. According to an example, the pre-treatment module 601 is located above the post-treatment module 602. The pre-treatment module 601 is provided at the same height as the application module 401. The post-treatment module 602 is provided at the same height as the development module 402. The pre-treatment module 601 has a protective film application chamber 610, a baking chamber 620, and a transfer chamber 630. The protective film application chamber 610, the transfer chamber 630, and the baking chamber 620 are sequentially arranged in the second direction 14. Thus, the protective film application chamber 610 and the baking chamber 620 are located to be spaced apart from each other in the second direction 14 with the transfer chamber 630 interposed therebetween. A plurality of protective film application chambers 610 are provided and are arranged in the third direction 16 to form layers therebetween. The protective film application chambers 610 may optionally be provided in the first direction 12 or the third direction 16. A plurality of baking chambers 620 are provided and are arranged in the third direction 16 to form layers therebetween. The plurality of baking chambers 620 may optionally be provided in the first direction 12 or the third direction 16.

The transfer chamber 630 is located in parallel with the first cooling chamber 530 of the buffer module 500 in the first direction 12. A pre-treatment robot 632 is located inside the transfer chamber 630. The transfer chamber 630 has a substantially square or rectangular shape. The pre-treatment robot 632 transports the substrate "W" between the protective film application chambers 610, the baking chambers 620, the buffer 520 of the buffer module 500, and a first buffer 720 of the interface module 700, which will be described below. The pre-treatment robot 632 has a hand 633, an arm 634, and a support 635. The hand 633 is fixedly installed in the arm 634. The arm 634 is provided in a stretchable structure and a rotatable structure. The arm 634 is coupled to the support 635 to be linearly movable in the third direction 16 along the support 635.

The protective film application chamber 610 applies, onto the substrate "W", the protective film protecting the photoresist film during the immersion exposure. The protective film application chamber 610 has a housing 611, a support plate 612, and a nozzle 613. The housing 611 has a cup shape having an open top. The support plate 612 is located inside the housing 611 and supports the substrate "W". The support plate 612 is provided rotatably. The nozzle 613 supplies a protective liquid for forming the protective film onto the substrate "W" placed on the support plate 612. The nozzle 613 has a circular tubular shape and may supply the protective liquid to the center of the substrate "W". Optionally, the nozzle 613 may have a length corresponding to the diameter of the substrate "W", and an outlet of the nozzle 613 may be provided as a slit. In this case, the support plate 612 may be provided in a fixed state. The protective liquid contains a foaming material. A material having a low affinity for the photoresist and water may be used as the protective liquid. For example, the protective liquid may contain a fluorine-based solvent. The protective film application chamber 610 supplies the protective liquid to the center of the substrate "W" while rotating the substrate "W" placed on the support plate 612.

The baking chamber 620 heat-treats the substrate "W" onto which the protective film is applied. The baking chamber 620 has a cooling plate 621 or a heating plate 622. The cooling plate 621 is provided with a cooling unit 623 such as cooling water or a thermoelectric element. Alternatively, the heating plate 622 is provided with a heating unit 624 such as a heating wire or a thermoelectric element. The heating plate 622 and the cooling plate 621 may be provided in one baking chamber 620. Optionally, some of the baking chambers 620 may be provided with only the heating plates 622 and the other thereof may be provided with only the cooling plates 621.

The post-treatment module 602 has a cleaning chamber 660, a post-exposure baking chamber 670, and a transfer chamber 680. The cleaning chamber 660, the transfer chamber 680, and the post-exposure baking chamber 670 are sequentially arranged in the second direction 14. Thus, the cleaning chamber 660 and the post-exposure baking chamber 670 are located to be spaced apart from each other in the second direction 14 with the transfer chamber 680 interposed therebetween. A plurality of cleaning chambers 660 may be provided and may be arranged in the third direction 16 to form layers therebetween. The plurality of cleaning chambers 660 may optionally be provided in the first direction 12 or the third direction 16. A plurality of post-exposure baking chambers 670 may be provided and may be arranged in the third direction 16 to form layers therebetween. The plurality of post-exposure baking chambers 670 may optionally be provided in the first direction 12 or the third direction 16.

The transfer chamber 680 is located in parallel with the second cooling chamber 540 of the buffer module 500 in the first direction 12 when viewed from above. The transfer chamber 680 has a substantially square or rectangular shape. A post-treatment robot 682 is located inside the transfer chamber 680. The post-treatment robot 682 carries the substrate "W" between the cleaning chambers 660, the post-exposure baking chambers 670, the second cooling chamber 540 of the buffer module 500, and a second buffer 730 of the interface module 700, which will be described below. The post-treatment robot 682 provided in the post-treatment module 602 may be provided in the same structure as that of the pre-treatment robot 632 provided in the pre-treatment module 601.

The cleaning chamber 660 cleans the substrate "W" after the exposure process. The cleaning chamber 660 has a housing 661, a support plate 662, and a nozzle 663. The housing 661 has a cup shape having an open top. The support plate 662 is located inside the housing 661 and supports the substrate "W". The support plate 662 is provided rotatably. The nozzle 663 supplies the cleaning liquid onto the substrate "W" placed on the support plate 662. Water such as deionized water may be used as the cleaning liquid. The cleaning chamber 660 supplies the cleaning liquid to the center of the substrate "W" while rotating the substrate "W" placed on the support plate 662. Optionally, while the substrate "w" rotates, the nozzle 663 may linearly or rotationally move from the center to the edge of the substrate "W".

The post-exposure baking chamber 670 heats the substrate "W", on which the exposure process has been performed, using far ultraviolet rays. In the post-exposure baking process, the substrate "W" is heated to amplify an acid generated in the photoresist by exposure so as to complete a change in the properties of the photoresist. The post-exposure baking chamber 670 has a heating plate 672. The heating plate 672 is provided with a heating unit 674 such as a heating wire a thermoelectric element. The post-exposure baking chamber 670 may further include a cooling plate 671 therein. The cooling plate 671 is provided with a cooling unit 673 such as cooling water or a thermoelectric element. In addition, optionally, a baking chamber having only the cooling plate 671 may be further provided.

As described above, in the pre-exposure or post-exposure treating module 600, the pre-treatment module 601 and the post-treatment module 602 are provided to be completely separated from each other. Further, the transfer chamber 630 of the pre-treatment module 601 and the transfer chamber 680 of the post-treatment module 602 may be provided to have the same size and may be provided to completely overlap each other when viewed from above. Further, the protective film application chamber 610 and the cleaning chamber 660 may be provided to have the same size and may be provided to completely overlap each other when viewed from above. Further, the baking chamber 620 and the post-exposure baking chamber 670 may be provided to have the same size and may be provided to completely overlap each other when viewed from above.

The interface module 700 transports the substrate "W" between pre-exposure or post-exposure treating module 600 and the exposure device. The interface module 700 has a frame 710, the first buffer 720, the second buffer 730, and an interface robot 740. The first buffer 720, the second buffer 730, and the interface robot 740 are located inside the frame 710. The first buffer 720 and the second buffer 730 are spaced apart from each other by a predetermined distance and are arranged to be stacked on each other. The first buffer 720 is disposed to be higher than the second buffer 730. The first buffer 720 is located at a height corresponding to the pre-treatment module 601, and the second buffer 730 is located at a height corresponding to the post-treatment module 602. When viewed from above, the first buffers 720 are aligned in the first direction 12 together with the transfer chamber 630 of the pre-treatment module 601, and the second buffers 730 are aligned in the first direction 12 together with the transfer chamber 680 of the post-treatment module 602.

The interface robot 740 is located to be spaced apart from the first buffer 720 and the second buffer 730 in the second direction 14. The interface robot 740 carries the substrate "W" between the first buffer 720, the second buffer 730, and the exposure device. The interface robot 740 has a structure substantially similar to that of the second buffer robot 560.

The first buffer 720 temporarily stores the substrates "W" before the substrates "W", on which the process has been performed in the pre-treatment module 601, is moved to the exposure device. Further, the second buffer 730 temporarily stores the substrates "W" before the substrates "W", on which the process has been completed in the exposure device, is moved to the post-treatment module 602. The first buffer 720 has a housing 721 and a plurality of supports 722. The supports 722 are arranged inside the housing 721 and are provided to be spaced apart from each other in the third direction 16. One substrate "W" is placed on each support 722. The housing 721 has openings (not illustrated) in a direction in which the interface robot 740 is provided and in a direction in which the pre-treatment robot 632 is provided, so that the interface robot 740 and the pre-treatment robot 632 may carry the substrate "W" in or out from the support 722 inside the housing 721. The second buffer 730 has a structure that is substantially similar to that of the first buffer 720. However, a housing 731 of the second buffer 730 has openings (not illustrated) in the direction in which the interface robot 740 is provided and in a direction in which the post-treatment robot 682 is provided. The interface module 700 may be provided with only the buffers and the robots as described above without providing a chamber in which a predetermined process is performed on the substrate "W".

The development chambers 800 have the same structure. However, the types of developers used in the development chambers 800 may be different from each other. The development chamber 800 is provided as a device for developing the substrate "W". The development chamber 800 removes a region, irradiated with light, of the photoresist on the substrate "W". In this case, a region, irradiated with the light, of the protective film is removed together. Only a region, not irradiated with the light, among the region of the photoresist and the region of the protective film may be removed according to the types of the selectively used photoresist.

Figure 5:
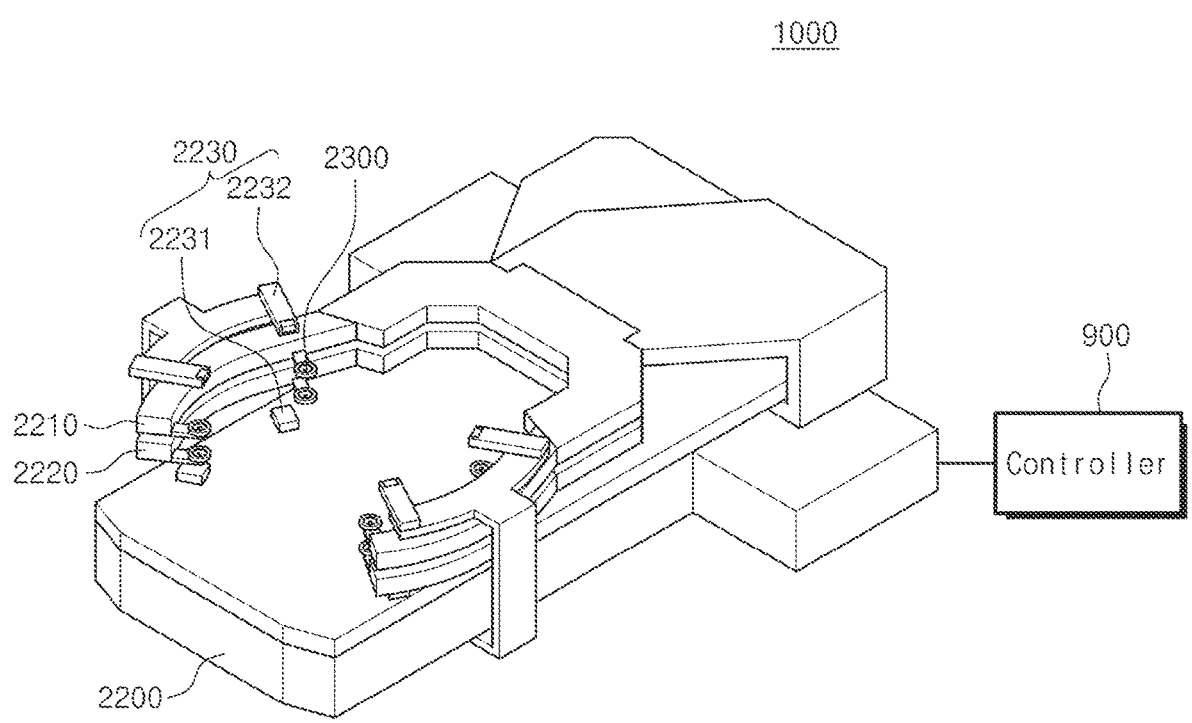
FIG. 5 is a view illustrating a transfer robot.

FIG. 5 is a view illustrating a transfer robot.

Like the index robot 220, the application unit robot 432, the development unit robot 482, the pre-treatment robot 632, the post-treatment robot 682, the interface robot 740 and the like, a transfer robot 1000 may be provided in the substrate treating apparatus 1 to transport substrates S1 and S2 from one location to another location.

Referring to FIG. 5, the transfer robot 1000 includes one or more hands 2210 and 2220, a pedestal 2200, and sensors 2230.

The transfer robot 1000 may include the first hand 2210 and the second hand 2220 located from above to below. The first hand 2210 and the second hand 2220 pick up and place the first substrate S1 and the second substrate S2, respectively. The hands 2210 and 2220 are provided with vacuum holes 2300 that form a vacuum pressure for suctioning the substrates S1 and S2. The plurality of vacuum holes 2300 may be provided.

The pedestal 2200 supports the hands 2210 and 2220. For example, the pedestal 2200 is provided in a block shape having a set volume, and the first hand 2210 and the second hand 2220 are coupled to the pedestal 2200 to be movable in a front-rear direction. The hands 2210 and 2220 may be provided in a shape of which the inside is opened in a vertical direction and may be provided to support outer bottom surfaces of the substrates S1 and S2.

The sensors 2230 detect locations of the substrates S1 and S2 located in the hands 2210 and 2220.

For example, four sensors 2230 may be provided at locations facing each other. The sensors 2230 include light emission units 2231 and light reception units 2232. The light emission units 2231 and the light reception units 2232 may be provided at locations corresponding to outer edges of the substrates S1 and S2, and thus the sensors 2230 may detect locations of the outer edges of the substrates S1 and S2.

The light emission units 2231 may be located below the second hand 2220, and the light reception units 2232 may be located above the first hand 2210 to vertically face the light emission units 2231. For example, the light emission units 2231 may be located on an upper surface or side surface of the pedestal 2200, and the light reception units 2232 may be located to be spaced apart from the first hand 2210 by a set distance in an upward direction. Further, in a similar manner, the light reception units 2232 may be located below the second hand 2220, and the light emission units 2231 may be located above the first hand 2210 to vertically face the light reception units 2232. Configurations of the hands 2210 and 2220 are not located in a space in which the light emission units 2231 and the light reception units 2232 face each other, and thus light emitted from the light emission units 2231 may be received by the light reception units 2232. Further, when the substrates S1 and S2 are located in the hands 2210 and 2220, the substrates S1 and S2 block the light, and the light reception units 2232 may detect outer locations of the substrates S1 and S2 through a region in which the light is received and a region in which the light is blocked.

A controller 900 may calculate location information of the substrates S1 and S2 through signals provided by the sensors 2230. Further, when the substrates S1 and S2 are placed, the controller 900 controls the index robot 220 using the calculated location information of the substrates S1 and S2 so that the substrates S1 and S2 are placed at correct positions. For example, the controller 900 may calculate locations of centers of the substrates S1 and S2 located in the hands 2210 and 2220 through the signals provided by the sensors 2230. Further, when the substrates S1 and S2 are placed, the controller 900 may control the index robot 220 so that the calculated center is placed at a set location.

According to an example, the controller 900 may determine whether or not the location of the substrate is normal on the basis of values measured by the sensors 2230. The controller 900 may measure sensor data on the basis of a case in which the wafer is not present and may process the measured sensor data as a reference value. According to an example, the reference value may be 0.000. However, the sensor may be misaligned due to untightening of a bolt, vibration, P/C or the like. When a value of the sensor is read in a state in which there is no wafer during diagnosis, when the value is higher or lower than predetermined limit values, it is considered that the reference point of the sensor is misaligned, and thus an alarm may be generated.

According to an example, when the limit value is set to 0.300 mm, when the measured value is 0.314 mm, it is considered that the value exceeds the limit value, and thus an alarm may be generated. When the alarm is generated, the sensor may be set again.

Figure 6:
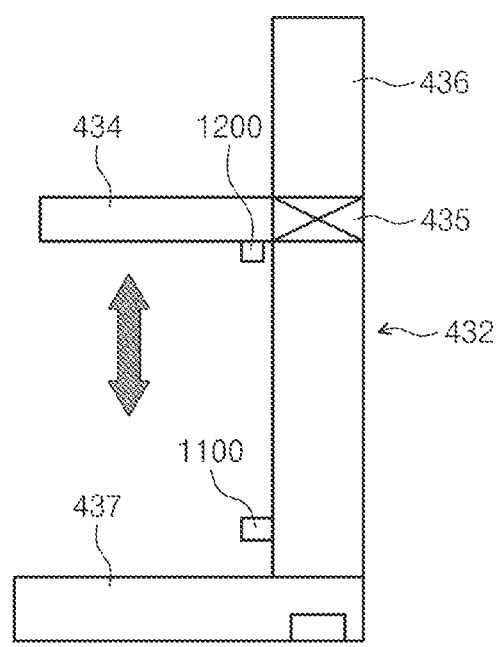
FIG. 6 is a cross-sectional view illustrating a transfer chamber according to the inventive concept.

FIG. 6 is a cross-sectional view illustrating a transfer chamber according to the inventive concept.

According to the inventive concept, a system for diagnosing a condition of the transfer robot and taking measures before a problem occurs is provided. According to an example, the condition of the transfer robot may be determined by diagnosing whether or not hardware is misaligned or a wafer measurement sensor reference is misaligned.

Referring to FIG. 6, an example of a determination system that may determine whether or not the transfer robot that transfers a substrate is normal is disclosed.

FIG. 6 illustrates an example of the application unit robot 432. According to FIG. 6, the application unit robot 432 has the hand 434, the arm 435, the support 436, and the pedestal 437. The configurations described above will be omitted and characteristic parts of the inventive concept will be described below.

Referring to FIG. 6, a determination system according to the inventive concept may include a sensor detection member 1200, a sensor member 1100, and a determination unit (not illustrated). According to an example, the sensor detection member 1200 may be attached to a moving member to transfer the substrate "W". According to an example, the sensor detection member 1200 may be attached to the hand 434. However, this is merely an example, and the sensor detection member 1200 may be attached to a member that is a moving subject in addition to the hand 434. According to an example, the sensor detection member 1200 may be a dog bar. According to an example, the sensor detection member 1200 may be attached to one end or a lower end of the member that is a moving subject. According to an example, the sensor detection member 1200 may be disposed at a location approachable to a location that may be detected through the sensor member 1100, which will be described below.

According to an example, the sensor member 1100 may be attached to a support member that supports the moving member to transfer the substrate "W". According to an example, the sensor member 1100 may be attached to the support 436. The sensor member 1100 may be provided in a fixed state while being attached to a fixed member. The sensor member 1100 may detect whether or not the sensor detection member 1200 is present. The sensor member 1100 may be a groove sensor.

According to an example, the determination unit (not illustrated) may determine whether or not the transfer robot is normal on the basis of a distance between the sensor detection member 1200 and the sensor member 1100. According to an example, the moving member to transfer the substrate "W" may be driven through a motor. The motor may be provided to be embedded in the transfer chamber. According to an example, the motor may be provided to be embedded in the support member or the moving member.

According to an example, the determination unit may determine whether or not the transfer robot is normal using a Z phase of the motor. The Z phase refers to an origin output phase and means that one pulse is output whenever an encoder connected to the motor performs one rotation.

That is, when the Z phase is used in the motor, the encoder connected to the driven motor performs one rotation, one pulse is output, and the moving member may move by an amount corresponding to the one pulse.

According to the inventive concept, the determination unit may set, as a first location, a location in which the sensor detection member 1200 may be detected in the sensor member 1100. A location in which the moving member moves from the first location by an amount corresponding to the Z phase in the motor may be set as a second location. Accordingly, the determination unit may determine whether or not the transfer robot is normal on the basis of a difference value between the second location and the first location.

In more detail, the determination unit according to the inventive concept may perform a control to periodically measure the difference value between the second location and the first location using the previously measured difference value between the second location and the first location as a reference value and to generate an alarm when a difference between the reference value and the difference value exceeds a predetermined range. Through this, when the transfer robot is abnormal, an error may be identified quickly, and measures may be taken accordingly.

According to the inventive concept, a distance measured an initial origin and a distance set as a reference are compared with each other on the basis of an initially measured point, that is, a distance between the first location and the sensor detection member 1200, and when the compared value deviates from a preset error range, an alarm may be generated. Accordingly, when a problem occurs, the existence of a trend and a temporary phenomenon may be identified using recorded data.

That is, according to the inventive concept, by diagnosing the condition of the robot in advance, equipment malfunction and loss of the wafer due to the occurrence of a problem during operation may be prevented in advance.

In the case of FIG. 6, a transfer robot capable of moving in a Z axis has been described as an example. However, the inventive concept is not limited thereto and may be applied to a transfer robot moving in various axes as long as the transfer robot is driven through the motor. According to an example, the inventive concept may be equally applied even to the transfer robot moving in an X axis, a Y axis, and the Z axis.

According to the inventive concept, as a diagnosis is periodically performed during operation, when an abnormality occurs in the condition of the transfer robot, the abnormality may be identified more quickly. According to an example, the diagnosis may be performed every 24 hours. According to an example, the diagnosis may be performed every 12 hours. Alternatively, according to an example, it may be set to perform to the diagnosis in a standby state of operation of the robot. That is, in the inventive concept, the robot may be diagnosed by periodically performing a Z phase distance inspection of the motor in the respective axes and a misalignment inspection of the sensor for detecting a position of the wafer.

This will be described below in more detail.

Figure 7A:
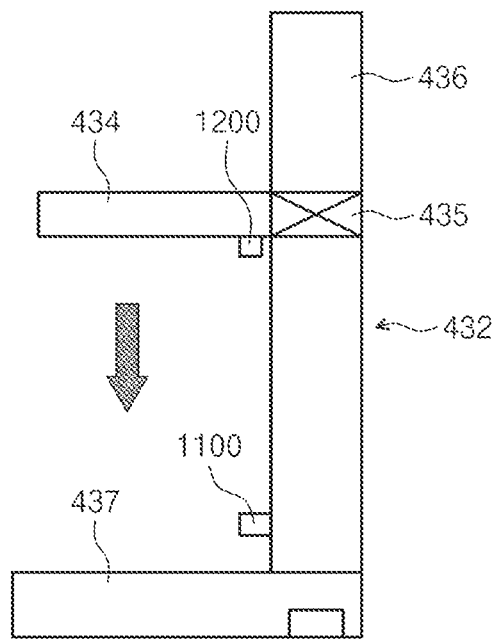
FIGS. 7A to 7C are views for describing robot diagnosis using the transfer chamber according to the inventive concept.
Figure 7B:
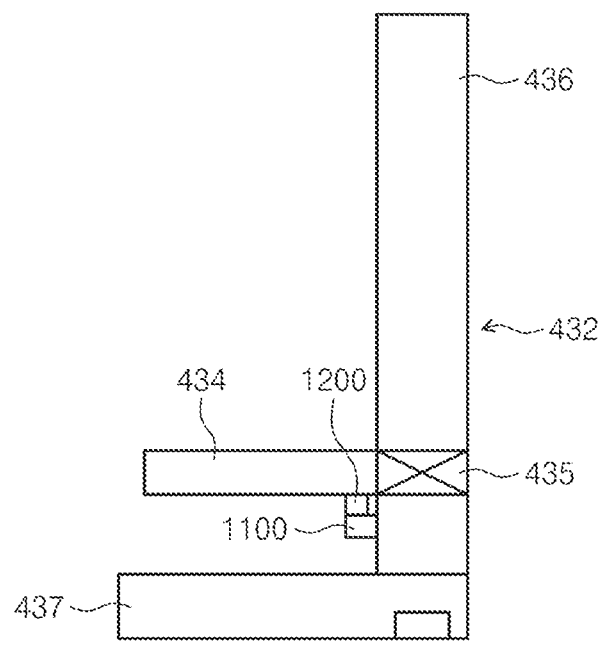
Figure 7C:
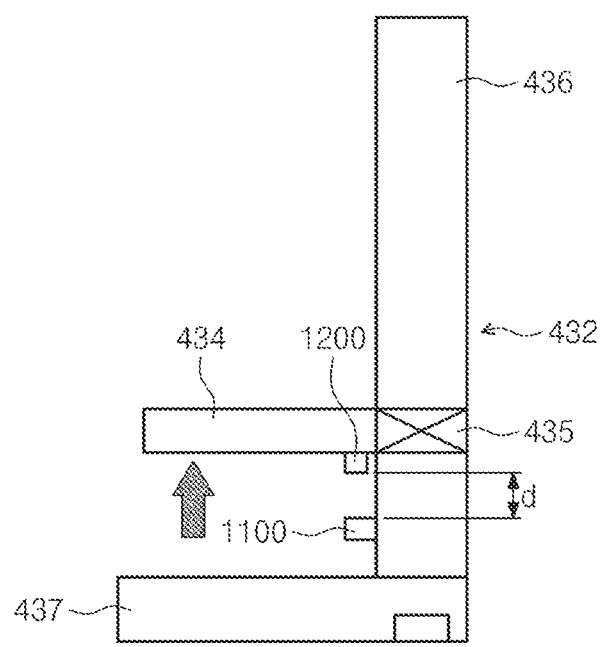

FIGS. 7A to 7C are views for describing robot diagnosis using the transfer chamber according to the inventive concept.

Referring to FIG. 7A, when a cycle for diagnosing the robot, for example, 24 hours has elapsed, the sensor detection member 1200 may be controlled to move to the first location so that the sensor detection member 1200 attached to the moving member may be detected through the sensor member 1100. This is illustrated through FIG. 7B. Referring to FIG. 7B, the sensor member 1100 disposed in a fixed location may detect the sensor detection member 1200 attached to the moving member and use the corresponding location as a reference location or a reference point. Thereafter, referring to FIG. 7C, the moving member may be driven by driving the motor by an amount corresponding to the Z phase of the motor. Thereafter, "d" denotes a distance between the sensor detection member 1200 and the sensor member 1100. A value of "d" obtained herein and the reference value are compared with each other, and when a difference therebetween exceeds a predetermined error range, an alarm is generated, and thus whether or not the transfer robot is normal may be easily diagnosed.

That is, in the inventive concept, by converting the Z phase corresponding to the basic property of the motor through a driving distance, whether or not the transfer robot is normal may be easily determined.

This will be described again as follows by applying numerical values.

In the inventive concept, a distance between the sensor member 1100 and the sensor detection member 1200 may be compared using the Z phase of the motor providing the movement of a transferred member.

When the transfer robot needs to start the diagnosis, the motor may move to detect the sensor member 1100 and move to find the Z phase after detecting the sensor member 1100. The motor has a unique pulse called the Z phase. One point may correspond to one rotation of the motor. It is assumed that a case in which a corresponding pulse value from the first location to the second location according to an example is 10000 pulses corresponds to a reference value.

When measurement is performed through the periodic diagnosis, when it is assumed that the corresponding pulse value from the first location to the second location is measured as 9000 pulses, a difference of 1000 pulses occurs, and when it is determined that the 1000 pulses corresponding to the difference exceeds a predetermined error range, an alarm may be generated. According to an example, the diagnosis may be performed through comparison based on the pulse of the motor and the diagnosis may be performed through comparing the converted distance.

Figure 8:
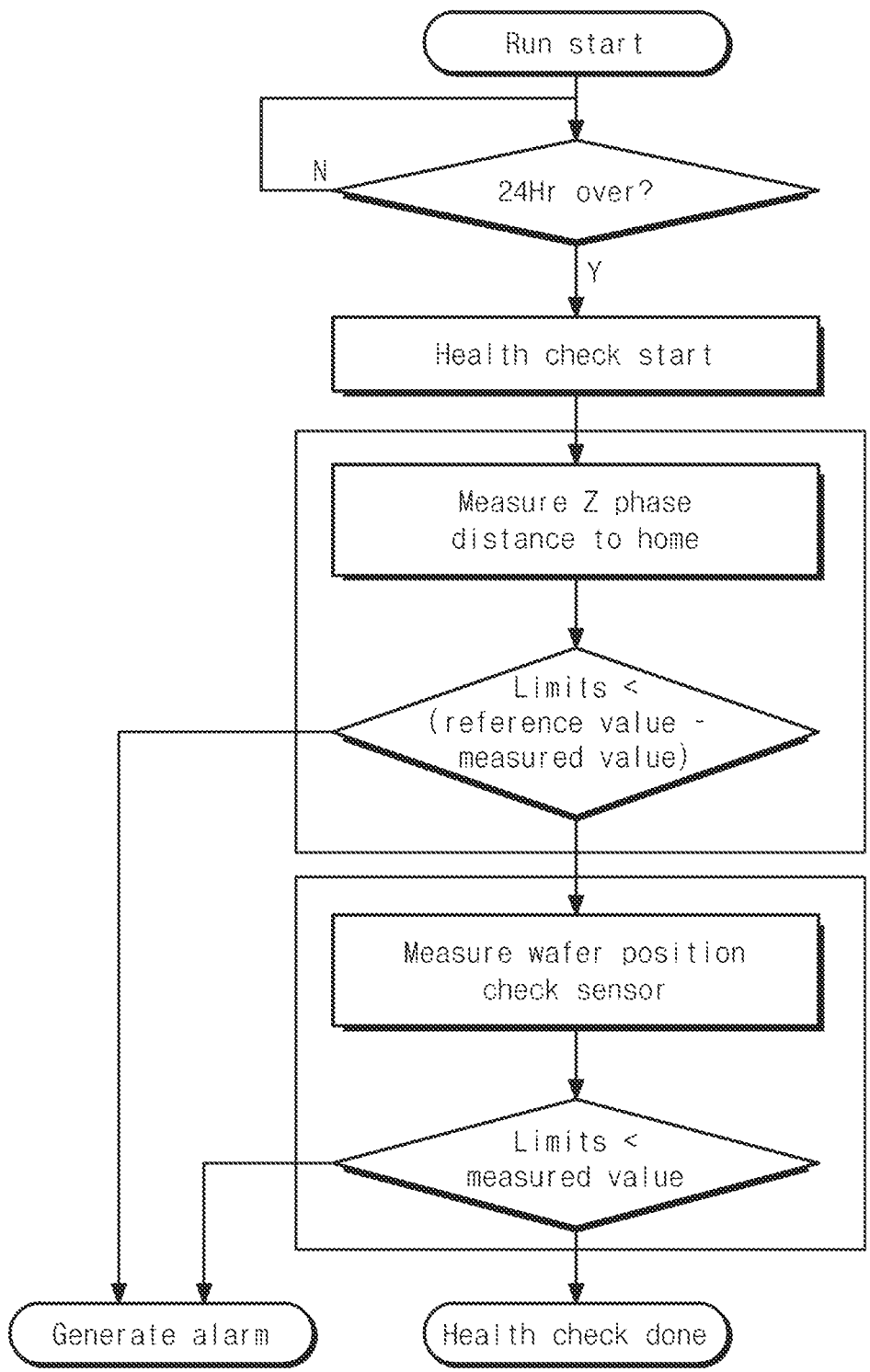
FIG. 8 is a flowchart illustrating a robot diagnosis method according to the inventive concept.

FIG. 8 is a flowchart illustrating a robot diagnosis method according to the inventive concept.

Referring to FIG. 8, a diagnosis method according to an example in which a diagnosis cycle is set to 24 hours is disclosed. When 24 hours have elapsed, a distance from a location of a groove, that is, the first location, to the second location changed by the Z phase may be measured. A preset limit value and the difference value between the second location and the first location are compared with each other, and when the difference value is greater than the limit value, an alarm may be generated.

A description will be made below in more detail.

The robot diagnosis method may include measuring a reference value for determining whether or not the transfer robot is normal, positioning the transfer robot to a reference location of the transfer robot, moving the transport robot by an amount corresponding to the Z phase of the motor driving the transfer robot, and comparing the reference value with a difference value between the reference location and a location in which the transfer robot is moved. According to an example, the positioning of the transfer robot to the reference location of the transfer robot may include positioning the transfer robot in a location in which the sensor member 1100 attached to a second member for supporting a first member is detected in the sensor detection member 1200 attached to the first member for driving the transfer robot. Thereafter, the moving of the transfer robot by the amount corresponding to the Z phase of the motor driving the transfer robot may include positioning the transfer robot in a location when the first member is driven by the amount corresponding to the Z phase of the motor driving the first member.

According to an example, the comparing of the reference value with the difference value between the reference location and the location in which the transfer robot is moved may include generating an alarm when the difference value deviates from an error range of the reference value.

According to an example, the positioning of the transfer robot to the reference location of the transfer robot, the moving of the transport robot by the amount corresponding to the Z phase of the motor driving the transfer robot, and the comparing of the reference value with the difference value between the reference location and the location in which the transfer robot is moved may be repeatedly performed at a certain period. According to an example, the measuring of the reference value for determining whether or not the transfer robot is normal may include setting, as a reference value, a value obtained by measuring and averaging the difference value between the reference location and the location in which the transfer robot is moved.

Further, when the measured value of the sensor that may check the location of the substrate is higher than the limit value, an alarm may be also generated.

According to the inventive concept, as a transfer robot is periodically inspected, measures may be taken before an error occurs.

According to the inventive concept, by diagnosing a condition of the transfer robot in advance, equipment malfunction and loss of the wafer due to the occurrence of a problem during operation may be prevented in advance.

The effect of the inventive concept is not limited to the above-described effects. The unmentioned effects may be clearly understood by those skilled in the art to which the inventive concept pertains from the present specification and the accompanying drawings.

It should be understood that the above embodiments are presented to help the understanding of the inventive concept and do not limit the scope of the inventive concept, and various embodiments that may be modified therefrom also belong to the scope of the inventive concept. The drawings provided in the inventive concept merely illustrate an optimal embodiment of the inventive concept. It should be understood that the technical protection scope of the inventive concept should be determined by the technical spirit of the appended claims, and the technical protection scope of the inventive concept is not limited to the literal description itself of the appended claims and substantially includes the inventive concept having an equivalent technical value.

What is claimed is:

1. A system for determining whether or not a transfer robot configured to transfer a substrate is normal, the system comprising:
   a sensor detection member attached to a moving member, the moving member configured to transfer the substrate;
   a sensor member attached to a support member, the support member configured to support the moving member; and
   a determination unit configured to determine whether or not the transfer robot is normal through a distance between the sensor detection member and the sensor member,
   wherein the moving member is driven through a motor to transfer the substrate, and
   wherein the determination unit determines:
      a first location, the first location being where the sensor detection member is detected in the sensor member;
      a second location, the second location being where the moving member moves from the first location by a Z phase of the motor; and
      whether or not the transfer robot is normal by measuring a reference value between the second location and the first location,
   wherein the determination unit performs a control, and
   wherein the control periodically measures a difference value between the second location and the first location and generates an alarm when a difference between the reference value and the difference value exceeds a certain range.

2. A substrate treating apparatus comprising a transfer chamber for transferring a substrate, wherein the transfer chamber includes:

a hand on which the substrate is placed;
an arm connected to the hand;
a first member configured to support the hand and the arm and move to transfer the substrate, wherein the first member is driven through a motor;
a second member configured to support the first member;
a sensor detection member attached to the first member;
a sensor member attached to the second member; and
a determination unit configured to determine whether or not the transfer chamber is normal through a distance between the sensor detection member and the sensor member,
wherein the determination unit is further configured to determine:
  a first location, the first location being where the sensor detection member is detected in the sensor member;
  a second location, the second location being where the first member moves from the first location by a Z phase of the motor; and
  whether or not the transfer chamber is normal by measuring a reference value between the second location and the first location,
wherein the determination unit performs a control, and
wherein the control periodically measures a difference value between the second location and the first location and generates an alarm when a difference between the reference value and the difference value exceeds a certain range.

* * * * *